(12) United States Patent
Czamara et al.

(10) Patent No.: US 9,485,885 B2
(45) Date of Patent: Nov. 1, 2016

(54) STABILIZING RACK SYSTEMS FOR SEISMIC LOADS

(71) Applicant: Amazon Technologies, Inc., Seattle, WA (US)

(72) Inventors: Michael Phillip Czamara, Seattle, WA (US); Osvaldo P. Morales, Seattle, WA (US); Brock Robert Gardner, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 0 days.

(21) Appl. No.: 14/634,455

(22) Filed: Feb. 27, 2015

(65) Prior Publication Data
US 2015/0181751 A1 Jun. 25, 2015

Related U.S. Application Data

(62) Division of application No. 13/625,514, filed on Sep. 24, 2012, now Pat. No. 8,967,392.

(51) Int. Cl.
| | |
|---|---|
| *H05K 7/14* | (2006.01) |
| *F16M 11/00* | (2006.01) |
| *F16M 13/00* | (2006.01) |
| *H05K 7/18* | (2006.01) |

(52) U.S. Cl.
CPC ............ *H05K 7/1489* (2013.01); *F16M 11/00* (2013.01); *F16M 13/00* (2013.01); *H05K 7/1488* (2013.01); *H05K 7/18* (2013.01)

(58) Field of Classification Search
CPC .......... E04H 9/00; E04H 9/02; E04H 9/021; E04B 1/98; E04B 1/985; H05K 7/18; F16M 11/00; F16M 13/00
USPC .............. 248/562, 618, 636, 638; 312/223.2, 312/351.1; 52/167.1; 211/26
See application file for complete search history.

(56) References Cited

U.S. PATENT DOCUMENTS

| | | | |
|---|---|---|---|
| 4,713,917 A | 12/1987 | Buckle et al. | |
| 5,386,962 A | 2/1995 | Adriance et al. | |
| 5,490,356 A | 2/1996 | Kemeny | |
| 5,653,070 A | 8/1997 | Seguin | |
| 5,655,756 A | 8/1997 | Robinson | |
| 5,682,712 A | 11/1997 | Kemeny | |
| 5,889,648 A | 3/1999 | Heavirland et al. | |
| 6,374,627 B1 * | 4/2002 | Schumacher et al. | 62/259.2 |
| 7,229,050 B2 * | 6/2007 | Schloss | 248/49 |

(Continued)

OTHER PUBLICATIONS

U.S. Appl. No. 13/682,641, filed Nov. 20, 2012, John William Eichelberg.

(Continued)

*Primary Examiner* — Joshua Rodden
(74) *Attorney, Agent, or Firm* — Robert C. Kowert; Meyertons, Hood, Kivlin, Kowert & Goetzel, P.C.

(57) ABSTRACT

A system for performing computing operations includes a rack that rests on a floor and a stabilization device coupled on the top of the rack. The stabilization device includes a mounting portion coupled to the rack, a ballast member, and one or more spring devices coupled between the ballast member and the mounting portion. The ballast member reduces displacement of the rack from seismic loads transmitted from the floor to the rack to mitigate effects of the seismic loads on the rack.

20 Claims, 10 Drawing Sheets

(56) References Cited

U.S. PATENT DOCUMENTS

| | | |
|---|---|---|
| 7,551,971 B2 | 6/2009 | Hillis |
| 8,240,490 B2 | 8/2012 | Malekmadani |
| 8,266,921 B2 | 9/2012 | Tashiro |
| 8,967,392 B1 | 3/2015 | Czamara et al. |
| 2003/0132077 A1 | 7/2003 | Davis |
| 2004/0244310 A1 | 12/2004 | Blumberg |
| 2007/0119794 A1 | 5/2007 | Hidaka et al. |
| 2008/0231151 A1 | 9/2008 | Barringer et al. |
| 2009/0000243 A1 | 1/2009 | Blumberg |
| 2010/0154687 A1 | 6/2010 | Blumberg |
| 2011/0017561 A1* | 1/2011 | Tanaka .......................... 188/378 |
| 2011/0146198 A1 | 6/2011 | Meisel et al. |
| 2011/0149508 A1 | 6/2011 | Malekmadani |
| 2011/0222800 A1 | 9/2011 | Hubbard et al. |
| 2011/0310724 A1 | 12/2011 | Martino |
| 2012/0031633 A1 | 2/2012 | Su et al. |
| 2012/0305356 A1 | 12/2012 | Sato |

OTHER PUBLICATIONS

U.S. Appl. No. 13/779,411, filed Feb. 27, 2013, Brock Robert Gardner.

U.S. Appl. No. 13/625,519, filed Sep. 24, 2012, Brock R. Gardner et al.

* cited by examiner

STABILIZING RACK SYSTEMS FOR SEISMIC LOADS

This application is a divisional of U.S. patent application Ser. No. 13/625,514, filed Sep. 24, 2012, now U.S. Pat. No. 8,967,392, which is hereby incorporated by reference in its entirety.

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Because a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 110V). A network of cabling, bus bars, power connectors, and power distribution units, is used to deliver the power at the lower voltage to numerous specific components in the facility.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a racking system. Some known racking systems include 40 such rack-mounted components and such racking systems will therefore generate as much as 10 kilowatts of waste heat. Moreover, some known data centers include a plurality of such racking systems. Some known data centers include methods and apparatus that facilitate waste heat removal from a plurality of racking systems, typically by circulating air through one or more of the rack systems.

From time to time, computing resources in data centers encounter adverse environmental conditions, such as earthquakes, floods, and fire. Vibration loads from an earthquake, for example, may cause substantial damages to rack computing systems. In some data centers, rack systems are bolted down the floor of a computing room to limit the effects of seismic loads on the computing resources. Bolting rack systems to the floor tends to reduce the risk of the rack system tipping over. Bolting rack systems to the floor may not, however, protect computing devices in the racks from damage from shaking in the portions of the rack above the floor under seismic loads.

Some data centers include sprinkler systems to contain damage from fire in a computing room. In many data centers, the sprinkler system for a computing room includes piping and sprinkler heads that are located in, or suspended from, the ceiling of the computing room. In some cases, these sprinkler systems distribute water beyond the area in which a fire is located. In such cases, some of the equipment lost in the event may be due to the water applied to areas beyond the location of the fire, rather than any fire itself.

Figure 1:
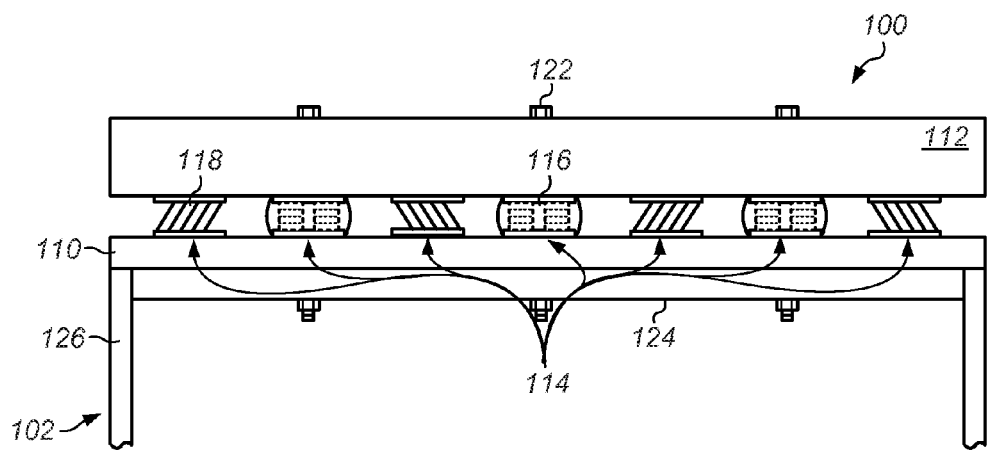
FIG. 1 is a side view illustrating one embodiment of a stabilization device on a rack computing system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Systems and methods for protecting electrical systems, such as computing devices operating in a data center, from environmental conditions are disclosed. According to one embodiment, a system for performing computing operations includes a rack that rests on a floor and a stabilization device coupled on the top of the rack. The stabilization device includes a mounting portion coupled to the rack, a ballast member, and one or more spring devices coupled between the ballast member and the mounting portion. The ballast member reduces displacement of the rack from seismic loads transmitted from the floor to the rack to mitigate effects of the seismic loads on the rack.

According to one embodiment, a stabilization device for a rack includes a mounting portion, one or more ballast members, and one or more spring devices coupled between the ballast members and the mounting portion. The ballast members reduce displacement of the rack from seismic loads transmitted from the floor to the rack.

According to one embodiment, a data center includes a plurality of racks on a floor. One or more stabilization devices are coupled to the rack computing systems. The stabilization devices include a mounting portion, one or more ballast members, and one or more spring devices coupled between the ballast members and the mounting portion. The ballast members reduce displacement of the rack from seismic loads transmitted from the floor to the rack.

According to one embodiment, a method of stabilizing computing devices under seismic loads includes providing one or more racks on a floor of a data center, and coupling, to at least some of the racks, a ballast member. The ballast member reduces displacement of the rack from seismic loads transmitted from the floor to the rack.

According to one embodiment, a data center includes a plurality of racks on a floor and one or more fire suppression systems coupled to at least some of the racks. The fire suppression systems include reservoirs mounted on the racks, a fire suppression material in the reservoir, and one or more material dispensing devices coupled to the reservoir. The material dispensing devices may dispense fire suppression material onto or into the racks in response to a fire condition.

According to one embodiment, a fire suppression system includes one or more mounting portions that mount to a rack, one or more reservoirs, a fire suppression material in the reservoirs, and one or more material dispensing devices. The material dispensing devices can dispense fire suppression material onto or into the rack in response to a fire condition.

According to one embodiment, a method of suppressing a fire in rack-mounted computing devices includes coupling a reservoir of fire suppression material on top of a rack, and dispensing at least a portion of the fire suppression material in response to a fire condition.

According to one embodiment, a fire suppression system includes one or more reservoirs in a computing room of a data center, a fire suppression material in the reservoirs, material dispensing devices. In response to a fire condition, the material dispensing devices can dispense fire suppression material under the floor of the computing room to suppress a fire under the floor of the computing room.

As used herein, "ballast member" includes any member, element, assembly, or device whose mass can be used to increase stability of a system to which it is coupled.

As used herein, "damping" includes any effect that tends to cause a reduction in amplitude of an oscillation. Damping may include viscous damping, coloumb damping, dry friction damping, interfacial damping, and eddy current damping. Examples of dampers include piston-cylinder viscous dampers, rubber bushings, friction dampers, and magneto-heological ("MR") dampers.

As used herein, to "mitigate" means to reduce the severity of, or risk of damage from, something, such as a load, phenomenon, or event.

As used herein, "seismic activity" means an event or series of events that result in release of energy from the Earth. The release of energy may be in the form of seismic waves.

As used herein, a "seismic load" is a load on a structure caused by acceleration induced on its mass by seismic activity, such as an earthquake, tremor, or temblor.

As used herein, a "shock mount device" includes any device, element, or combination thereof, that connects two or more parts elastically. A shock mount device may include, for example, one or more wire springs. In certain embodiments, a shock mount device includes damping elements. A shock mount device may or may not bear the weight of the parts that it connects. For example, a shock mount device may be connected across two plates arranged side-by-side that are each supported by other elements or devices, such as blocks or bearings.

As used herein, a "spring device" means an object that is least partially made of an elastic material and that stores mechanical energy when it is altered from its free condition by a force. A spring device may be a single piece of material or an assembly of two or more pieces of materials. Examples of spring devices include coil springs, lead rubber bearings, helical springs, leaf springs, gas springs, Belleville washers, and rubber bands.

As used herein, an "aisle" means a space next to one or more racks.

As used herein, "ambient" refers to a condition of outside air at the location of a system or data center. An ambient temperature may be taken, for example, at or near an intake hood of an air handling system.

As used herein, a "cable" includes any cable, conduit, or line that carries one or more conductors and that is flexible over at least a portion of its length. A cable may include a connector portion, such as a plug, at one or more of its ends.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, "data center infrastructure" means systems, components, or elements of a system that provide resources for computing devices, such as electrical power, data exchange capability with external systems, air, heat removal, and environmental control (for example, humidity control, particulate control).

As used herein, an "operating environment", in the context of computing resources, means the space, facilities and infrastructure resources provided for the computing resources. An operating environment for a set of rack computing systems includes the space, power, data interchange, cooling, and environmental control resources provided for the set of computing systems.

As used herein, "rack computing systems" means a computing system that includes one or more computing devices mounted in a rack.

As used herein, "room" means a room or a space of a building. As used herein, "computing room" means a room of a building in which computing devices, such as rack-mounted servers, can be operated.

As used herein, a "space" means a space, area or volume.

In some embodiments, a stabilization device is mounted on a rack. The stabilization device may include a ballast member that is coupled to the rack by way of spring devices. The stabilization device may mitigate the effects of external loads on a rack. In certain embodiments, the stabilization device may stabilize a rack under seismic load conditions. For example, a stabilization device may inhibit a rack from tipping over during an earthquake. A stabilization device for a rack may stabilize the rack, the computing devices in a rack, or both. In some embodiments, a stabilization device reduces displacement in computing devices under seismic loads.

Figure 2:
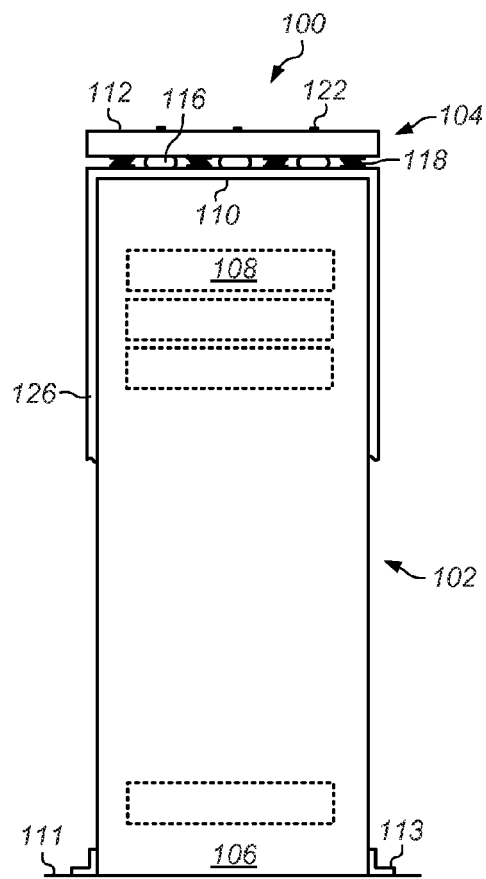
FIG. 2 is a side view of a rack computing system with a top-mounted stabilization device.
Figure 3:
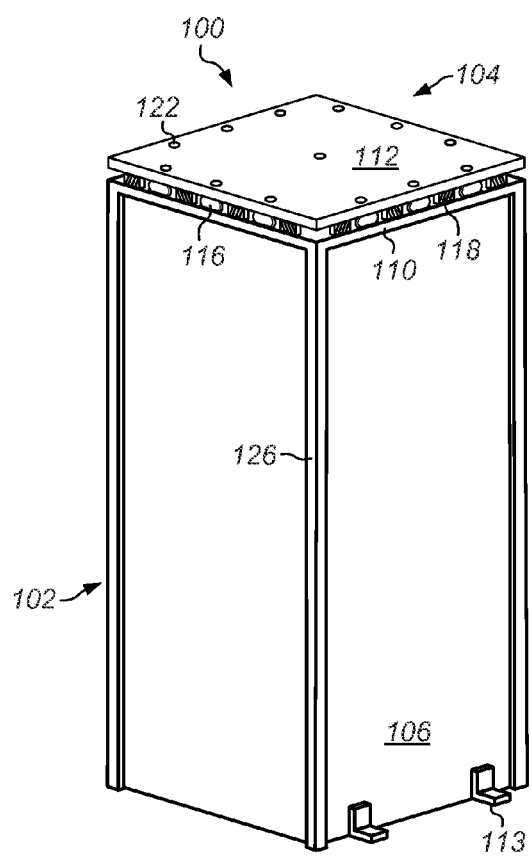
FIG. 3 illustrates one embodiment of a rack computing system with a top-mounted stabilization device.

FIG. 1 is a side view illustrating one embodiment of a stabilization device on a rack computing system. FIG. 2 is a side view of a rack computing system with a stabilization device. FIG. 3 illustrates one embodiment of a rack computing system with a stabilization device. System 100 includes rack computing system 102 and stabilization device 104. Rack computing system 102 includes rack 106 and computing devices 108. Rack computing system 102 may be deployed in a computing room of a data center. Computing devices 108 may be operated to perform computing operations in the data center.

Stabilization device 104 includes mounting plate 110, ballast plate 112, and spring devices 114. Spring devices 114 include bearings 116 and shock mount devices 118.

Bearings 116 couple ballast plate 112 with mounting plate 110. Ballast plate 112 may be, in some embodiments, be made of metal. In one embodiment, bearings 116 are lead rubber bearings. Bearings 116 may support the weight of ballast plate 112. Bearings 116 may serve as spring devices that allow some movement of ballast plate 112 relative to rack 106 when environmental loads, such as seismic loads, are encountered.

In some embodiments, shock mount devices 118 include both spring devices and damping elements. A stabilization device may nevertheless in various embodiments include only spring devices (for example, with no damping elements), or only damping elements (for example, with no springs). In one embodiment, shock mount devices 118 are wire shock absorbers.

In some embodiments, bearings 116 resist up-and-down motion of ballast plate 112 relative to rack 106, and shock mount devices 118 resist side-to-side motion (for example, swaying) of ballast plate 112 relative to rack 106. Ballast plate 112 may stabilize rack 106, computing devices 108, or both. Ballast plate 112 may mitigate the effect of the seismic loads on rack 106 and computing devices 108.

In some embodiments, spring devices in a stabilization device may be adjusted. For example, in the embodiment shown in FIG. 1, stabilization device 104 includes tensioning bolts 122. Tensioning bolts 122 may pass through ballast plate 112, bearing 116, base plate 110 and top panel 124 of rack 106. One of tensioning bolts 122 may be installed for each of bearings 116. To adjust the response of the spring elements bearing 116, the tensioning bolt passing through the bearing may be tightened or loosened. Tightening a tensioning bolt for one or bearings 116 may allow relatively less movement of ballast plate 112.

Angle brackets 126 are coupled to mounting plate 110. Angle brackets 126 may couple on the corners of rack 106. In some embodiments, angle brackets 126 are secured to rack 106 using screws or bolts. Angle brackets 126 may secure stabilization device 104 on rack 106. Angle brackets 126 may provide structural support for the stabilization device. In the embodiment illustrated in FIG. 3, angle brackets 126 extend all the way to the bottom of the rack. In certain embodiments, angle brackets 126 are coupled to the floor. In other embodiments, angle brackets may extend only part way down on the rack (for example, half way down).

In some embodiments, spring elements of a stabilization system are mounted directly to a panel of a rack without a separate mounting plate. For example, bearings 116 and shock mount devices 118 may each be mounted to the top panel of a rack by way of a threaded fastener. In certain embodiments, the mounting portion of a stabilization device, is part of the structure of a rack (for example, integral with a top panel or frame of the rack).

Racks 106 are secured to floor 111 by way of anchor brackets 113. Anchoring racks 106 on floor 111 may provide additional stabilize rack computing systems 102. Nevertheless, anchor brackets 113 may, in some embodiments, be omitted, and racks 106 may rest on floor 111 without being fastened to the floor.

In some embodiments, spring elements in different spring devices in a stabilization device in are oriented in different directions. For example, spring elements in each successive one of spring devices 114 may be slanted in the opposite direction (leftward slant, then rightward slant, then leftward slant, and so on). Each spring device orientation may stabilize rack computing systems 102 from loads in different directions.

Figure 4:
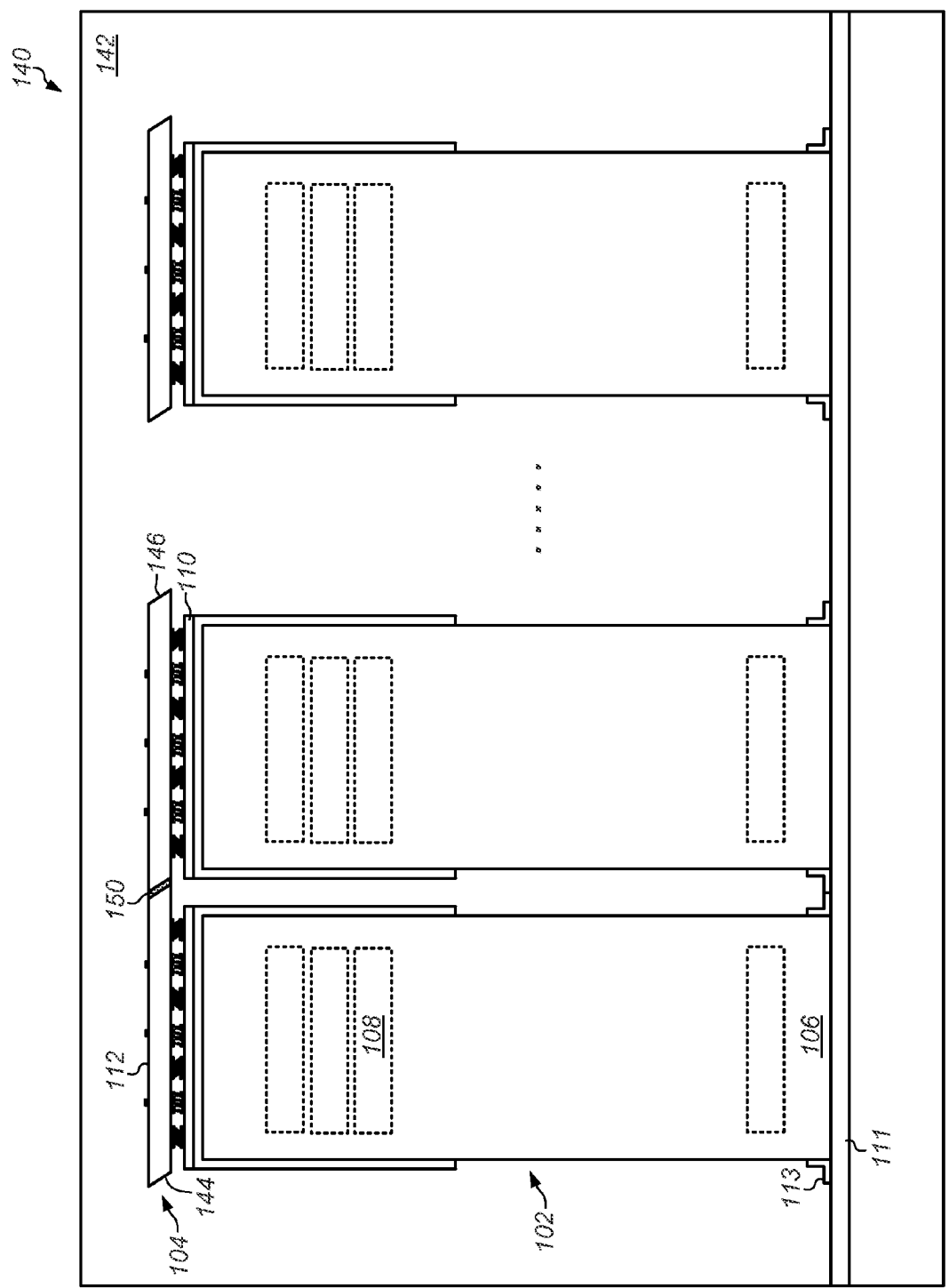
FIG. 4 illustrates one embodiment of a data center including rack stabilization devices with ballast members that are coupled to one another.

In some embodiments, stabilization devices on two or more racks in a data center are coupled to one another. FIG. 4 illustrates one embodiment of a data center having rack stabilization devices with ballast members that are coupled to one another. Data center 140 includes rack computing systems 102 on floor 111 in computer room 142. Each of rack computing systems 102 includes a rack 106 and rack computing devices 108. One of stabilization devices 104 is mounted on each of rack computing systems 102. Each of stabilization devices 104 may be coupled to one or more stabilization devices mounted to the adjacent rack computing systems. In this example, for each connection between stabilization devices, the stabilization devices may have complementary features. For example, in the data center shown in FIG. 4, the left side of each of ballast plates 112 of stabilization devices 104 has a downwardly angled bevel 144, and the right side of each of ballast plates 112 has an upwardly angled bevel 146. At each junction, the surface with the upwardly-facing bevel may be coupled with a corresponding surface having a downwardly facing bevel on the adjacent mounting plate.

In some embodiments, a coupling element is provided at the junction between ballast members. For example, in the example shown in FIG. 4, coupling element 150 is provided between adjacent ballast members. In some embodiments, coupling element includes springs, damping elements, or both. In some embodiments, the mating surfaces of the ballast members may slide with respect to one another. In certain embodiments, an interlocking arrangement (such as a tongue and groove connection) is provided at the junction between ballast members.

In some embodiments, rack computing systems having stabilization devices are cross-coupled in two directions. For example, stabilization devices on a set of racks arranged in rows and columns may be cross-coupled one after another within each row, and the stabilization devices on each rack in the row may also be coupled to a stabilization device on racks in an adjacent row.

Figure 5:
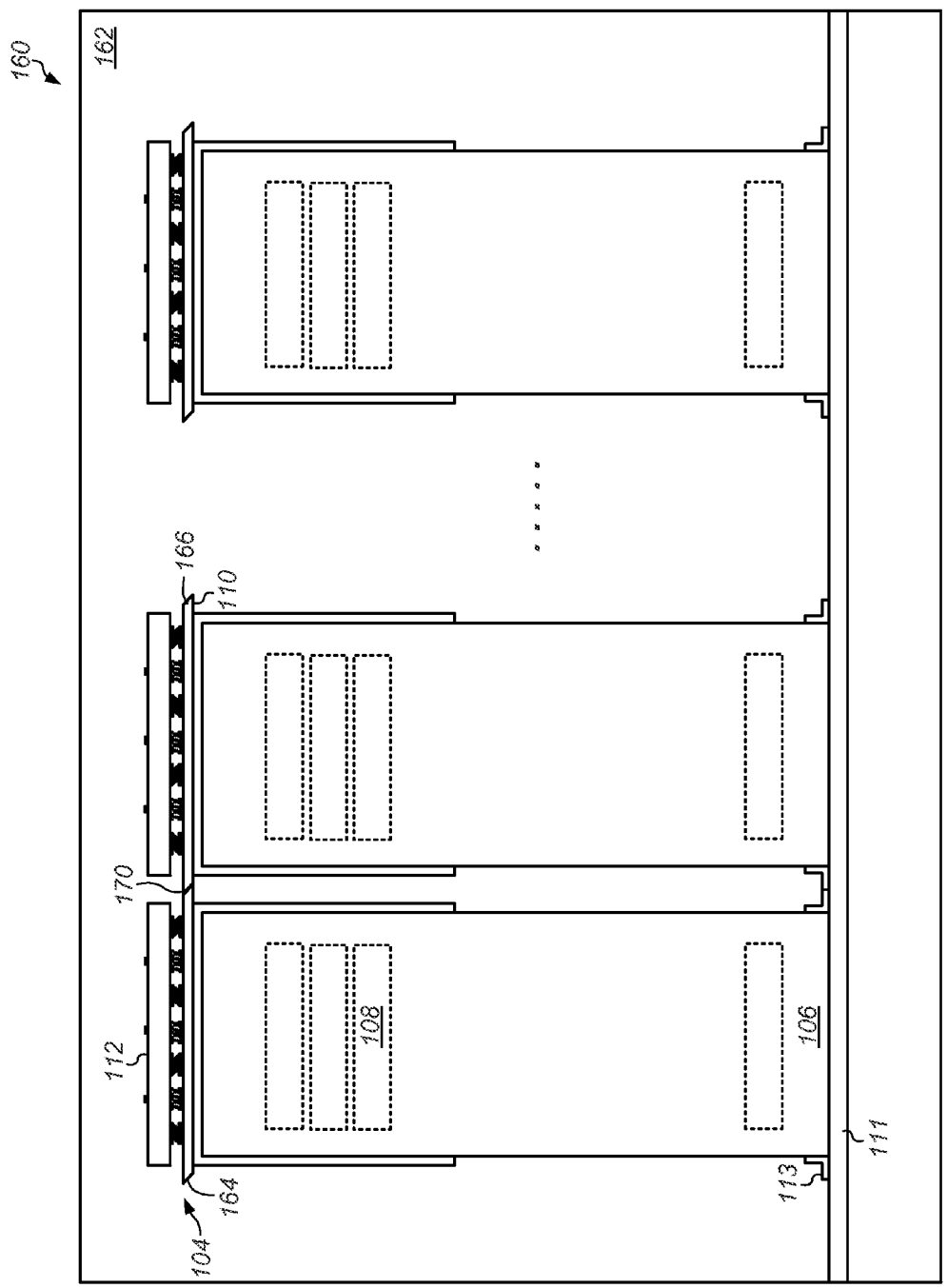
FIG. 5 illustrates an embodiment of a data center including rack stabilization devices with base plates coupled to one another.

FIG. 5 illustrates an embodiment of a data center including rack stabilization devices with base plates coupled to one another. Data center 160 includes rack computing systems 102 on floor 111 in computer room 162. Each of rack computing systems 102 includes a rack 106 and rack computing devices 108. One of stabilization devices 104 is mounted on each of rack computing systems 102. Base plate 110 of each of stabilization devices 104 may be coupled to one or more base plates of stabilization devices mounted to the adjacent rack computing systems. The left side of each of mounting plates 110 of stabilization devices 104 has a downwardly angled bevel 164, and the right sides of each of mounting plates 110 has an upwardly angled bevel 166. At each junction, the surface with the upwardly-facing bevel may be coupled with a corresponding surface having a downwardly facing bevel on the adjacent mounting plate.

Figure 6:
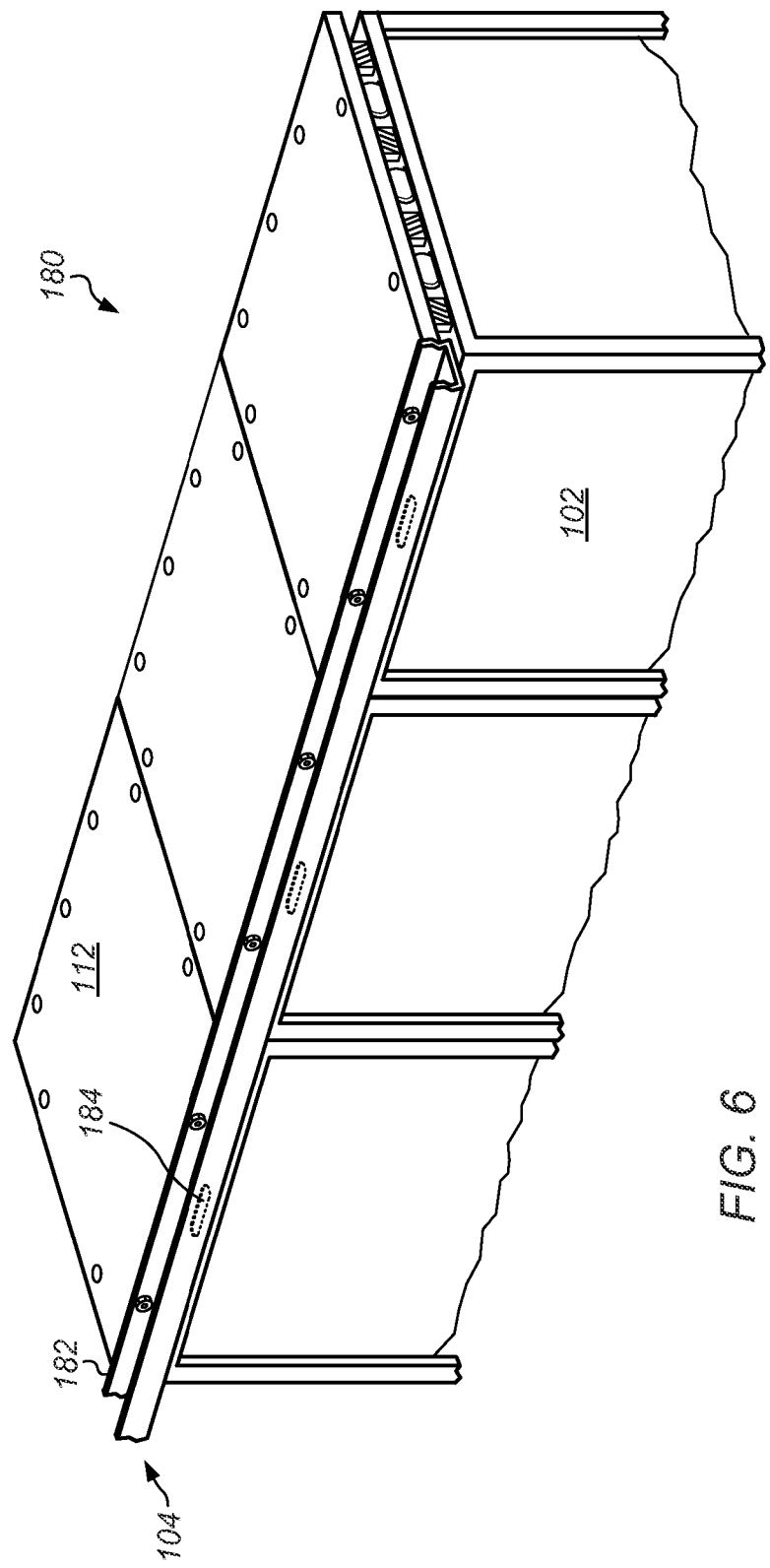
FIG. 6 illustrates one embodiment of a cable tray for rack computing systems with stabilization devices.

Coupling element 170 is provided between adjacent base plates. In some embodiments, shock mount elements are provided at a connection between base plates on adjacent racks. For example, a spring or elastomeric cushion may be provided between the adjoining edges of the mounting plates of adjacent racks. In certain embodiments, the adjoining surfaces of base plates may slide with respect to one another at the FIG. 6 illustrates one embodiment of a cable tray for rack computing systems with stabilization devices. System 180 includes stabilization devices 104 and cable tray 182. Each of stabilization devices 104 may be mounted on a different rack computing system 102 in a computing room. Cable tray 182 may carry cables, including optical fiber cables and electrical cables for the rack computing systems. Cable tray 182 may be attached (for example, using screws or bolts), to ballast members 104 of stabilization devices 104. For each of the rack computing systems, cables may be fed through passages 184. Passages 184 may extend through the bottom of cable tray 182 and through an opening in the rack computing system. In some embodiments one or more rack switches are mounted to stabilization device 104.

In some embodiments, a cable tray structurally couples two or more stabilization devices in a manner that increases the stability of the rack computing systems. For example, in the embodiment illustrated in FIG. 6, cable tray 182 may couple stabilization devices 04 to stabilize rack computing systems 102.

In the embodiment illustrated in FIG. 6, cable tray is installed on the front faces of stabilization devices 104. A cable tray may, however, be coupled to the rear faces of stabilization devices, or in other locations. For example, cable tray 182 may be coupled across the tops of the stabilization devices 104.

Figure 7:
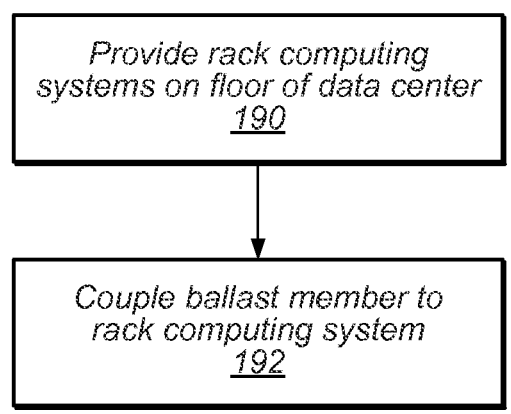
FIG. 7 illustrates stabilizing rack computing systems using rack-mounted stabilization devices.

FIG. 7 illustrates stabilizing rack computing systems using rack-mounted stabilization devices. At 190, rack computing systems are provided on a floor of a data center. In some embodiments, rack computing systems are provided in two or more rows. In some embodiments, the racks are anchored to the floor of a data center (for example, bolted down).

At 192, a ballast member may be coupled to one or more of the rack computing systems. The ballast member may reduce displacement of the rack computing system from seismic loads transmitted from the floor to the rack computing system. In some embodiments, the ballast member is coupled by way of one or more spring devices.

In some embodiments, a fire suppression device is mounted on top of a rack. The fire suppression device may include a reservoir that holds a fire suppression material. The fire suppression material may be released in response to a fire condition. The fire suppression device may dispense the fire suppression material onto or into the rack. In some embodiments, a fire suppression reservoir is included in a stabilization device.

Figure 8:
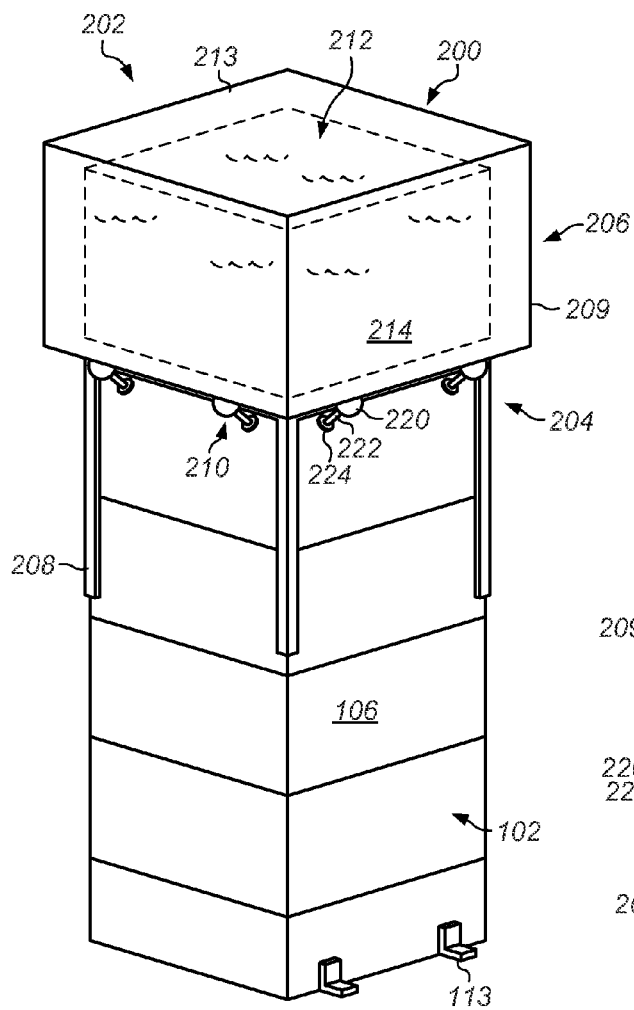
FIG. 8 illustrates one embodiment of a fire suppression device on a rack computing system.
Figure 9:
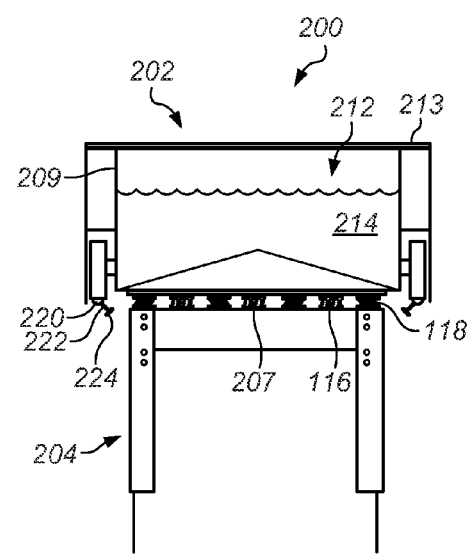
FIG. 9 is a side view illustrating a fire suppression device on a rack.
Figure 10:
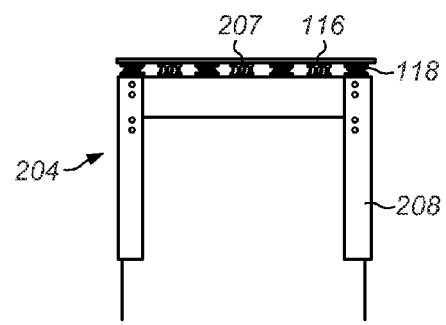
FIG. 10 is a side view illustrating a mounting base for a fire suppression device.

FIG. 8 illustrates one embodiment of a fire suppression device on a rack computing system. FIG. 9 is a side view illustrating a fire suppression device on a rack. FIG. 10 is a side view illustrating a mounting base for a fire suppression device.

System 200 includes rack computing system 102 and fire suppression device 202. Rack computing system 102 may include a rack and computing devices in the rack, such as described above relative to FIGS. 1-3. Rack computing system 102 may be deployed in a computing room of a data center. The computing devices may be operated to perform computing operations in the data center.

Fire suppression device 202 includes mount assembly 204 and reservoir assembly 206. Mount assembly 204 includes mounting base 207 and brackets 208. Each of brackets 208 may correspond to one of the corners of rack 106. Brackets 208 may be used to secure mounting base on rack 106. Brackets 208 may be attached by way of fasteners, such as a bolts or screws. In certain embodiments, a mounting base may be integral to a rack enclosure. For example, the roof a rack may serve as a mounting base for a fire suppression device. In such case, a reservoir assembly may be fastened directly to the roof of the rack (for example, bolted to the roof).

Mounting base 207 may include mounting plate 110, bearings 116, and shock mount devices 118. Bearings 116 and shock mount devices 118 may be as described above relative to FIGS. 1-3. Bearings 116 and shock mount devices 118 may support reservoir 206 in a manner similar to that described above for ballast plate 112 shown in FIGS. 1-3.

Rack 106 may be secured to a floor by way of anchor brackets 113. Anchoring racks 106 on a floor may provide additional stabilize rack computing systems 102. Nevertheless, anchor brackets 113 may, in some embodiments, be omitted, and racks 106 may rest on the floor without being attached.

Reservoir assembly 206 includes reservoir body 209, reservoir cover 213, and dispensing devices 210. Reservoir body 208 defines reservoir 212. Fire suppression material 214 is held in reservoir 212.

Each of dispensing devices 210 include mount 220, thermal fuse 222, and spray tip 224. Dispensing devices 210 may overhang rack 106. Each of dispensing devices 210 may be in fluid communication with reservoir 212.

Thermal fuse 222 may trigger when the temperature at the location of the fuse reaches a predetermined temperature. In one embodiment, thermal fuse includes a material that melts at a predetermined temperature. Once a thermal fuse has been triggered for one of the dispensing devices 210, fire suppression material 214 from reservoir 212 may be dispensed through spray tip 224 of that dispensing device.

In the embodiment shown in FIGS. 8 and 9, each of dispensing devices 210 may have its own thermal fuse. Nevertheless, in certain embodiments, two or more dispensing devices may be enabled by triggering of the same thermal fuse. A thermal fuse for a rack mounted fire suppression system may be any suitable location. In one embodiment, a thermal fuse is inside of a rack (for example, the rack that is being protected by the fire suppression system).

In certain embodiments, a fire suppression system is activated by a mechanism other than a thermal fuse. For example, in some embodiments, a fire suppression device is controlled using a control unit. The control unit may trigger the fire suppression device based on a temperature sensor, smoke detector, or other sensing device.

In some embodiments, spray tip 224 may move as fire suppression material is dispensed from dispensing devices 224. In one embodiment, spray tip 210 rotates in a manner that distributes fire suppression material across surfaces of rack 106. A dispensing device may rotate such that the spray direction pans from side of the rack to the other. In certain embodiments, a dispensing device oscillates back and forth from left to right.

Although dispensing devices 210 are shown a single point delivery elements, other types of dispensing devices may be used in various embodiments. For example, a dispensing device may be a perforated bar that spans across all or a portion of the width of a rack.

In various embodiments, fire suppression material may be any suitable material that can be drawn from a reservoir, container, or vessel. Fire suppression material may be a liquid, a solid, or a gas, or a combination thereof. In one embodiment, fire suppression material 214 is water. In certain embodiments, a fire suppression material a powder.

In certain embodiments, a reservoir is pressurized such that fire suppression material is dispensed under pressure. For example, in certain embodiments, a carbon dioxide pressure system may be coupled to reservoir 212 to promote delivery of fire suppression material 214 from reservoir 212.

Figure 11:
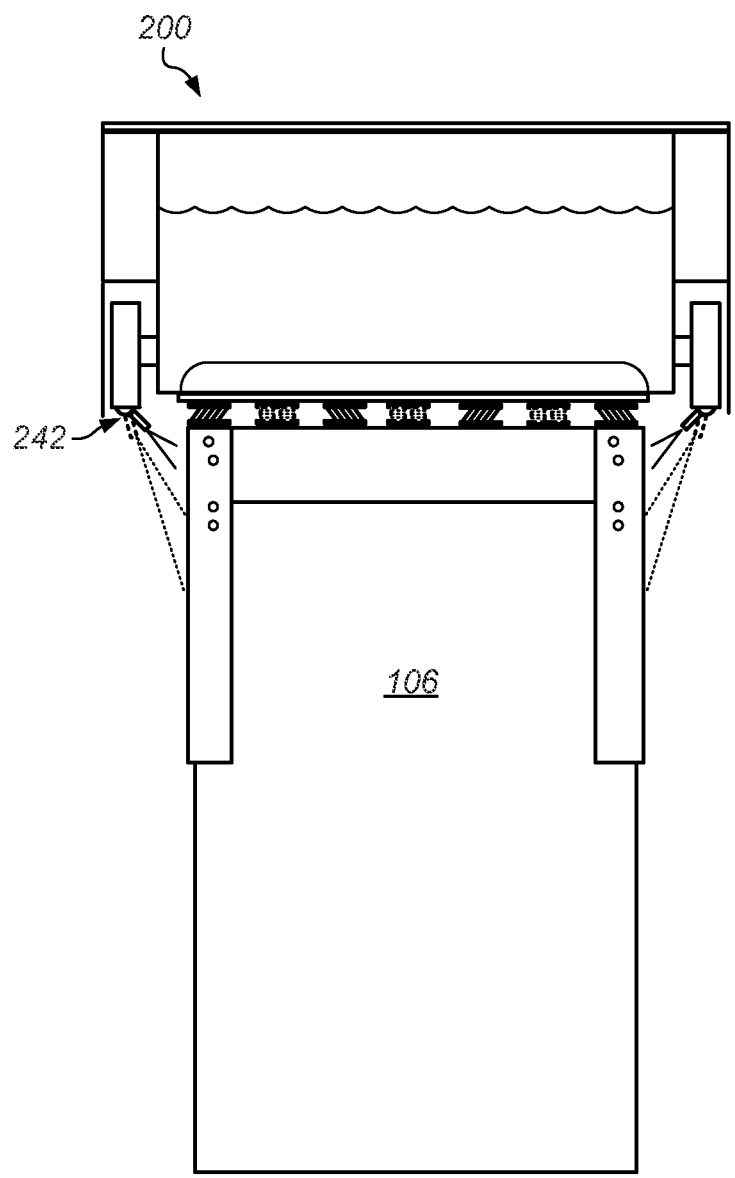
FIG. 11 illustrates dispersion of fire suppression material onto a rack computing system in one embodiment.

In some embodiments, a dispensing device automatically changes the direction of a nozzle as the fire suppression material is dispensed. FIG. 11 illustrates dispersion of fire suppression material onto a rack computing system in one embodiment. Initially, the nozzle of dispensing device 242 may be directed to spray on the sides of rack 106 at or near the top of the rack. As material is dispensed from dispensing device 242, dispensing device 242 may rotate downward such that nozzle 240 points progressively lower on rack 106. In some embodiments, the nozzle may move about horizontal spray direction to about 90 degrees downward.

Figure 12:
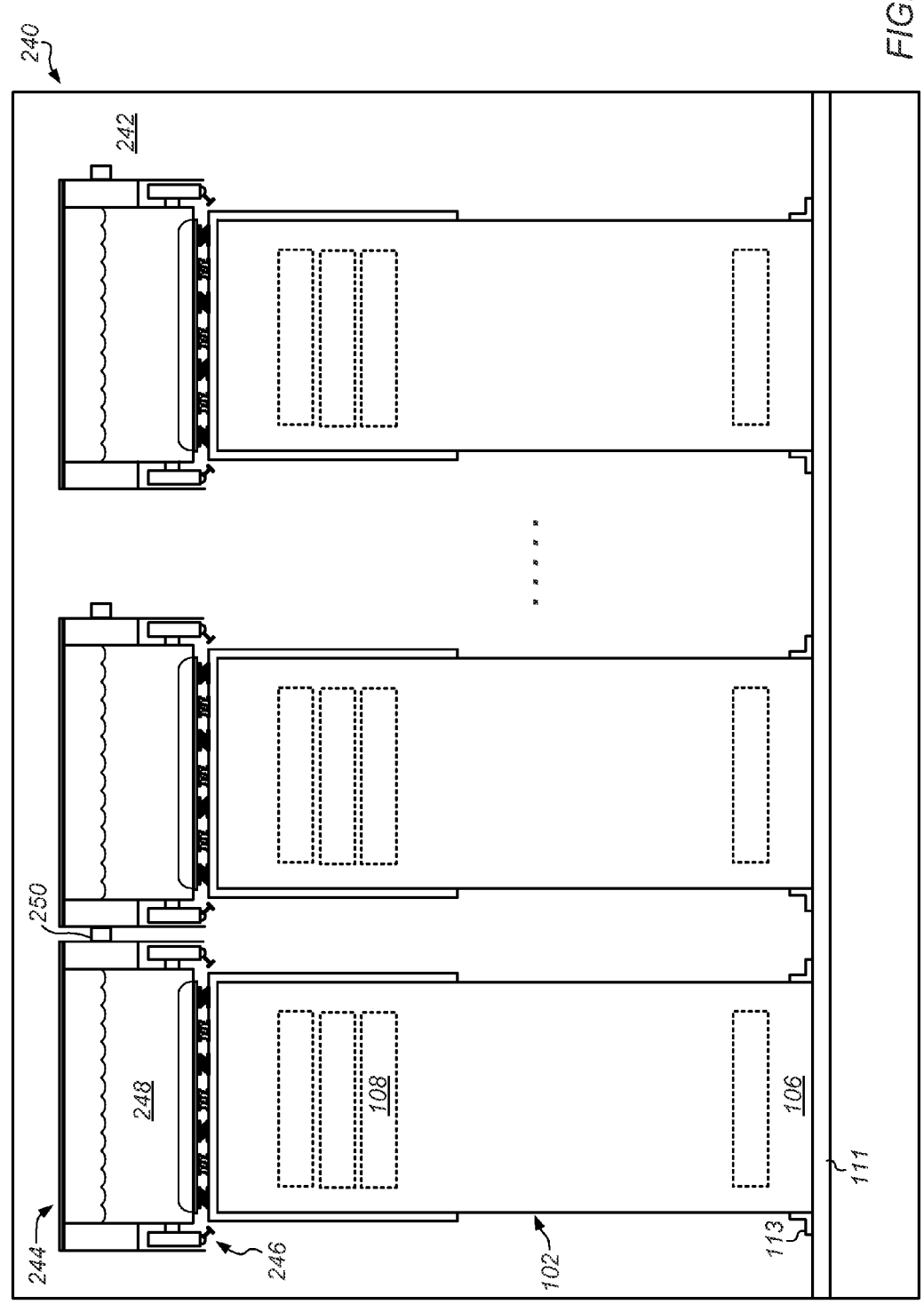
FIG. 12 illustrates one embodiment of a data center including fire suppression devices mounted on rack computing systems.

In some embodiments, two or more rack computing systems in a data center includes rack-mounted fire suppression devices. FIG. 12 illustrates one embodiment of a data center including fire suppression devices mounted on rack computing systems. Data center 240 includes rack computing systems 102 on floor 111 in computer room 242. Each of rack computing systems 102 includes a rack 106 and rack computing devices 108. One of fire suppression devices 244 is mounted on each of rack computing systems 102. Each of fire suppression devices includes dispensing devices 246 and reservoir 248. Fire suppression devices 244 may operate to dispense fire suppression material in response to fire conditions in a manner as described above relative to FIGS. 8, 9, 10, and 11.

Coupling element 250 is provided between adjacent fire suppression devices. Coupling element 250 may provide a physical link between reservoir assemblies. In certain embodiments, coupling element includes springs, damping elements, or both.

In certain embodiments, fire suppression systems on different racks may be coupled in fluid communication with one another. For example, reservoirs 248 may be connected by a fluid passage through coupling element 250. Fluid coupling between reservoirs may augment a supply of fire suppression material that can be dispensed through one the dispensing devices in a particular rack. In certain embodiments, a fluid link between reservoirs on different rack may be established by triggering of a thermal fuse (for example a thermal fuse in coupling element 250).

Figure 13A:
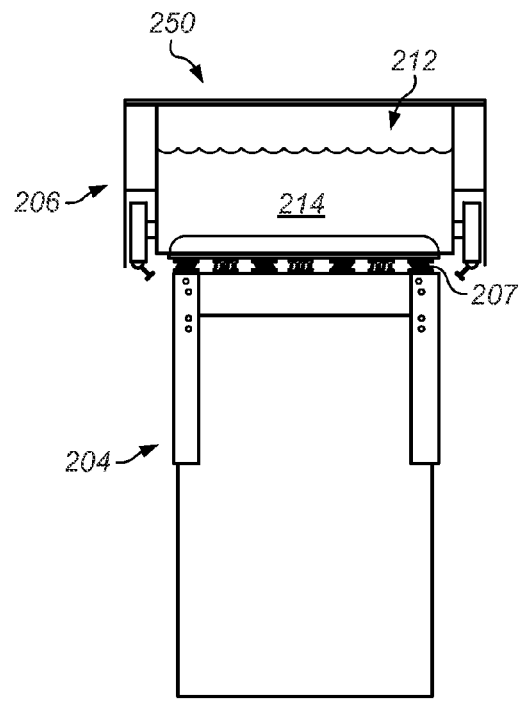
FIG. 13A and FIG. 13B illustrate one embodiment of a rack with a fire suppression system mounted for stabilizing the rack.
Figure 13B:
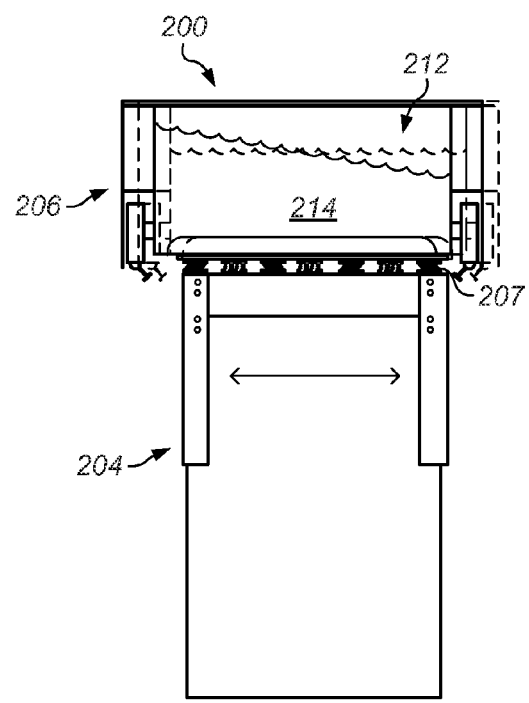

In some embodiments, a rack-mounted fire suppression system serves as a stabilization device for a rack computing system. FIG. 13A and FIG. 13B illustrate one embodiment of a rack with a fire suppression system mounted for stabilizing the rack. Mounting base 207 may include load bearing devices and shock mount devices. The load bearing devices and shock mount devices may be as described above relative to FIGS. 1-3.

In some embodiments, a reservoir for a rack-mounted fire suppression system includes a liquid that only partially fills the reservoir. Thus, when vibrations are encountered, the liquid in the reservoir may shift within the reservoir (for example, slosh back and forth) in a manner that dampens loads on a rack. In some embodiments, a fire suppressing liquid dampens seismic loads on a rack. As illustrated in FIG. 13B, for example, as side-to-side oscillating loads are encountered the fire suppression material may shift to one side or the other of the reservoir.

Figure 14:
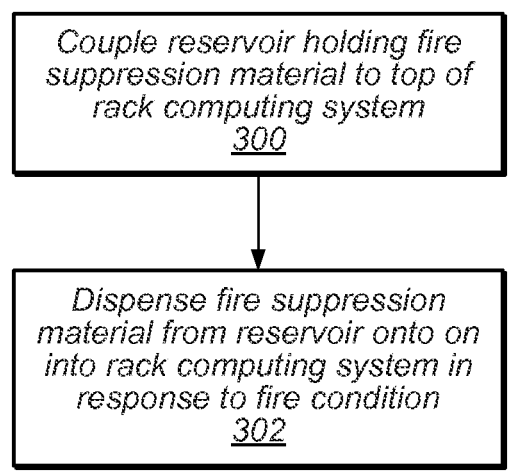
FIG. 14 illustrates one embodiment of suppressing fire in rack-mounted computing devices.

FIG. 14 illustrates one embodiment of suppressing fire in rack-mounted computing devices. At 300, a reservoir holding fire suppression material is coupled to the top of a rack computing system. In some embodiments, the reservoir is part of a stabilization device for the rack. Each of the rack computing systems in data center may be provided with a fire suppression system. In some embodiments, fire suppression system on different racks may be coupled one another.

At 302, fire suppression material from the reservoir is dispensed onto or into the rack computing system in response to a fire condition. Release of the fire suppression material may be triggered by a thermal fuse. The thermal fuse may be a block a material that melts at predetermined temperature. In certain embodiments, the release of fire suppression material may be activated or propelled by a charge.

In some embodiments, a dispensing device may be move to distribute fire suppression material to different portions of a rack. For example, a dispensing device may rotate such that a nozzle of the dispensing device pans from top to bottom of a rack.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system for performing computing operations, comprising:
   a plurality of racks configured to rest on a floor and coupled, independently of the floor, to one another; and
   a plurality of stabilization devices each respectively coupled to a top of respective ones of the plurality of racks, wherein individual ones of the plurality of stabilization devices comprise:
      a base plate;
      a ballast member; and
      one or more spring devices coupled between the ballast member and the base plate,
      wherein the ballast member is configured to reduce displacement of at least a portion of the respective rack from seismic loads transmitted from the floor to the respective rack to mitigate effects of the seismic loads on the respective rack, based at least in part upon movement of the ballast member relative to the respective rack when seismic loads are transmitted from the floor to the respective rack, and
      wherein the plurality of racks are coupled to one another via respective ones of the base plates of the plurality of stabilization devices, wherein individual ones of the respective base plates are coupled to one or more adjacent ones of the base plates of the one or more adjacent stabilization devices mounted on one or more adjacent ones of the racks.

2. The system of claim 1, wherein the one or more spring devices comprise:
   one or more load bearing devices configured to support the ballast member on the base plate; and
   one or more shock mount devices configured to resist horizontal motion of the ballast member under seismic loads.

3. The system of claim 2, wherein at least one of the load bearing devices is a lead rubber bearing.

4. The system of claim 2, wherein at least one of the shock mount devices comprises a metal spring.

5. The system of claim 1, further comprising one or more anchoring devices, wherein at least one of the anchoring devices is configured to secure at least one of the racks to the floor.

6. A rack, comprising:
   a stabilization device comprising:
      a base plate;
      a ballast member; and
      one or more spring devices coupled between the ballast member and the base plate;
   wherein the base plate comprises one or more beveled mating surfaces along one or more edges of the base plate, wherein respective ones of the one or more mating surfaces are configured to couple, independently of the floor, to respective ones of one or more complementary beveled mating surfaces of one or more baseplates mounted on additional racks on the floor, and
   wherein the ballast member is configured to reduce displacement of at least a portion of the rack from seismic loads transmitted from the floor to the rack, based at least in part upon movement of the ballast member relative to the rack when seismic loads are transmitted from the floor to the rack.

7. The rack of claim 6, wherein the base plate is configured to mount on top of the rack.

8. The rack of claim 6, wherein the one or more spring devices comprise:
   one or more load bearing devices configured to support the ballast member on the base plate; and
   one or more shock mount devices configured to resist horizontal motion of the ballast member under seismic loads.

9. The rack of claim 8, wherein at least one of the load bearing devices is a lead rubber bearing.

10. The rack of claim 8, further comprising one or more tensioning members configured to adjust tension in at least one of load bearing devices.

11. The rack of claim 6, wherein the base plate is configured to couple on the rack.

12. The rack of claim 6, wherein the base plate is integral to at least one panel of the rack.

13. The rack of claim 6, wherein the base plate is part of a mounting portion that comprises mounting brackets configured to couple on one or more corners of the rack.

14. The rack of claim 6, wherein the ballast member comprises a ballast plate.

15. The rack of claim 6, wherein the ballast member comprises a fire suppression device, wherein the fire suppression device comprises a reservoir and fire suppression material in the reservoir, wherein the fire suppression device is configured to dispense at least a portion of the fire suppression material in response to a fire condition.

16. The rack of claim 15, wherein the reservoir is partially filled with a liquid, wherein the liquid is configured to move within the reservoir in response to side-to-side seismic loads such that the seismic loads on the rack are dampened.

17. A data center, comprising:
   a floor;
   a plurality of racks coupled, independently of the floor, to one another; and
   a plurality of stabilization devices coupled to respective ones of the plurality of racks, wherein individual ones of the stabilization devices comprise:
      a base plate;
      a ballast member; and
      one or more spring devices coupled between the ballast member and the base plate,
      wherein the ballast member is configured to reduce displacement of at least a portion of the rack from seismic loads transmitted from the floor to the rack, based at least in part upon movement of the ballast member relative to the rack when the seismic loads are transmitted from the floor to the rack, and
      wherein the plurality of racks are coupled to one another via the base plates of the plurality of stabilization devices, wherein individual ones of the base plates are coupled to one or more adjacent ones of the base plates of one or more adjacent ones of the stabilization devices mounted on one or more adjacent ones of the racks.

18. The data center of claim 17, wherein, for at least one of the one or more stabilization devices, the one or more spring devices comprise:
   one or more load bearing devices configured to support the ballast member on the base plate; and
   one or more shock mount devices configured to resist horizontal motion of the ballast member under seismic loads.

19. The data center of claim 17, wherein each of at least two of the stabilization devices is coupled to the top of a different one of the racks.

20. The data center of claim 17, further comprising a cable tray coupled on the front or the rear of at least one of the stabilization devices.

* * * * *